United States Patent
Hwee et al.

(10) Patent No.: US 7,456,496 B2
(45) Date of Patent: *Nov. 25, 2008

(54) PACKAGE DESIGN AND METHOD OF MANUFACTURE FOR CHIP GRID ARRAY

(75) Inventors: Tan Kim Hwee, Singapore (SG); Roman Perez, Singapore (SG); Kee Kwang Lau, Singapore (SG); Alex Chew, Singapore (SG); Antonio Dimaano, Singapore (SG)

(73) Assignee: Advanpack Solutions Pte Ltd, Singapore (SG)

(*) Notice: Subject to any disclaimer, the term of this patent is extended or adjusted under 35 U.S.C. 154(b) by 526 days.

This patent is subject to a terminal disclaimer.

(21) Appl. No.: 11/128,014

(22) Filed: May 12, 2005

(65) Prior Publication Data

US 2005/0205987 A1 Sep. 22, 2005

Related U.S. Application Data

(62) Division of application No. 10/236,337, filed on Sep. 6, 2002, now Pat. No. 6,929,981.

(51) Int. Cl.
*H01L 23/02* (2006.01)
*H01L 23/52* (2006.01)
*H01L 23/48* (2006.01)
*H01L 29/40* (2006.01)

(52) U.S. Cl. .............. 257/691; 257/738; 257/E21.499; 257/E23.061

(58) Field of Classification Search ......... 257/701–788, 257/E21.499, E23.061; 438/106–127
See application file for complete search history.

(56) References Cited

U.S. PATENT DOCUMENTS

| | | | |
|---|---|---|---|
| 5,824,569 A | 10/1998 | Brooks et al. | 438/127 |
| 5,994,773 A | 11/1999 | Hirakawa | 257/702 |
| 6,063,646 A | 5/2000 | Okuno et al. | 438/107 |
| 6,232,213 B1 | 5/2001 | King et al. | 438/613 |
| 6,278,192 B1 | 8/2001 | Takigawa et al. | 257/787 |
| 6,294,100 B1 * | 9/2001 | Fan et al. | 216/14 |
| 6,353,259 B1 | 3/2002 | Sato et al. | 257/738 |
| 6,562,658 B2 | 5/2003 | Ohuchi et al. | 438/113 |
| 6,656,996 B2 | 12/2003 | Tsutsumi et al. | 524/492 |
| 6,734,039 B2 | 5/2004 | Hwee et al. | 438/106 |
| 2002/0033412 A1 | 3/2002 | Tung | 228/215 |

* cited by examiner

*Primary Examiner*—Matthew S. Smith
*Assistant Examiner*—Walter H Swanson

(57) ABSTRACT

A chip level package utilizing a CGA is described. A semiconductor chip with pillars is molded in an encapsulant. Solder balls are added and connected to the chip pillars. The final package does not require a first level substrate or interposer and is able to be assembled to the next level as is. An additional embodiment describes the addition of a thermal heat sink to the packaged chip.

16 Claims, 6 Drawing Sheets

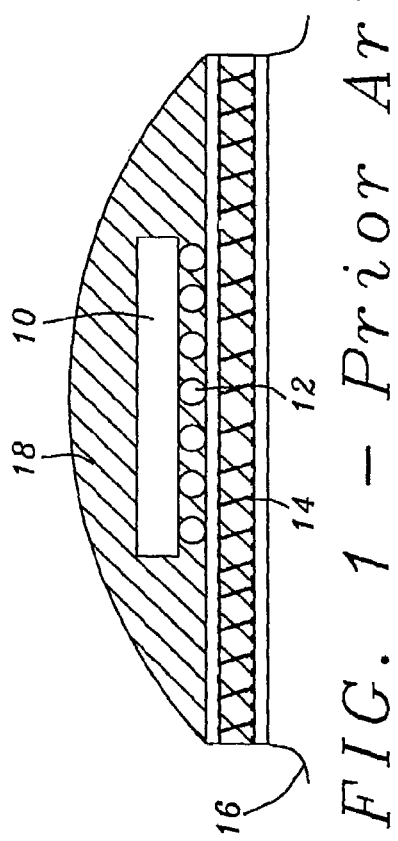
FIG. 1 – Prior Art
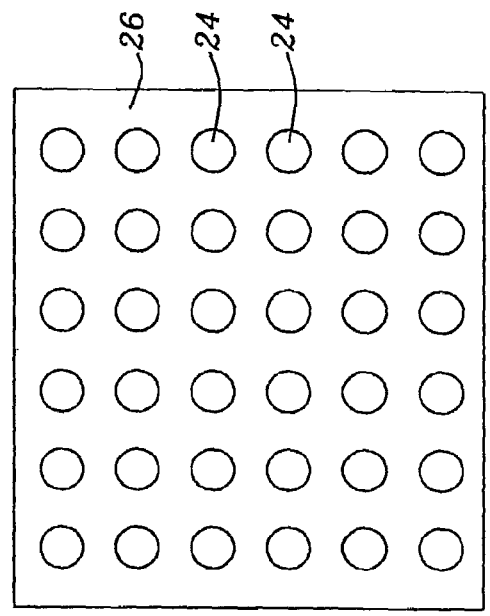
FIG. 2B
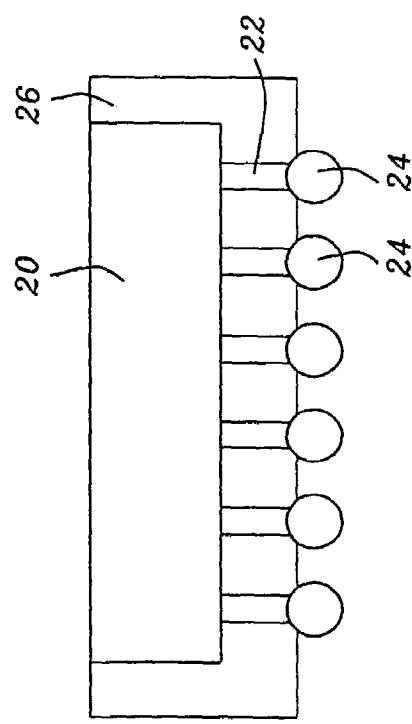
FIG. 2A

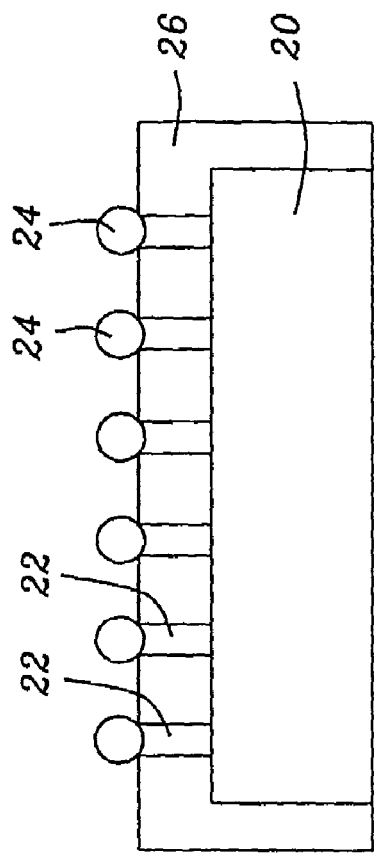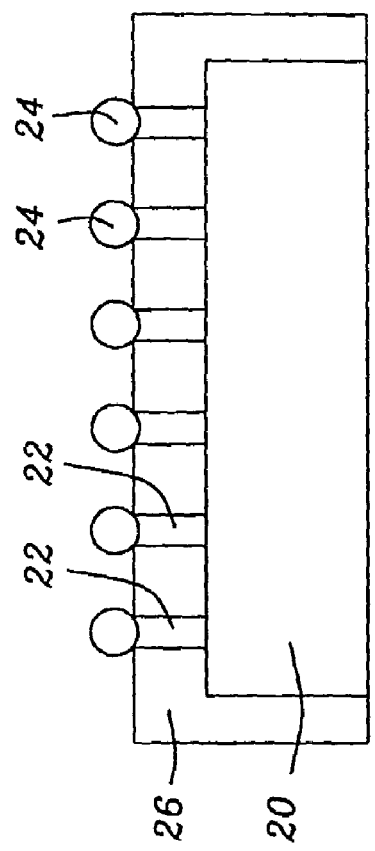
FIG. 8

PACKAGE DESIGN AND METHOD OF MANUFACTURE FOR CHIP GRID ARRAY

This is a divisional of U.S. patent application Ser. No. 10/236,337, filed Sep. 6, 2002, now U.S. Pat. No. 6,929,981 and assigned to the same assignee as the present invention.

BACKGROUND OF THE INVENTION

1. Field of the Invention

This invention relates in general to the design and method of manufacture of packages for semiconductor chips, and the input, output (I/O), interconnections to the chips, and more specifically to a semiconductor package that utilizes a method of manufacture, molding an encapsulant that encapsulates the semiconductor chip but allows the interconnections and the backside of the semiconductor chip to be free of encapsulant.

2. Description of the Related Art

The following three U.S. patents and one U.S. patent application relate to semiconductor chip packaging designs.

U.S. Pat. No. 5,994,773 dated Nov. 30, 1999, issued to T. Hirakawa describes a BGA package incorporating a semiconductor chip and a printed circuit interposer. The chip is wire bonded to the interposer that has BGA interconnects.

U.S. Pat. No. 6,232,213 dated May 15, 2001, issued to J. L. King and J. M. Brooks shows a semiconductor chip wire bonded to a lead frame that has BGA interconnects incorporated. The assembly is encapsulated.

U.S. Pat. No. 6,353,259 dated Mar. 5, 2002, issued to T. Sato, N. Okabe, Y. Kameyama, and M. Saito discloses a design and process for a semiconductor device with peripheral interconnects utilizing TAB tape to interconnect the semiconductor to a BGA.

U.S. Patent Application Publication, U.S. 2002/0033412A1 published Mar. 21, 2002, by F. Tung describes the use of Cu copper pillars on semiconductor chips, and is assigned to the same assignee as the instant invention.

The advent of VLSI technology in the semiconductor field has resulted in the demand for high-density packaging. Semiconductor packaging traditionally has three levels of package. The first level, a single chip module (SCM) is made up of a semiconductor chip attached to a substrate. A substrate and chip assembly is usually molded in an encapsulant for environmental protection. The second level of package, usually a printed circuit card, mounts and interconnects the single chip modules and has a connector system to the third level package, usually a planar printed circuit board.

Elimination of a level of package has been a driving force in electronic system design in the recent past. This reduction in packaging levels would allow for closer spacing of semiconductor chips thereby reducing signal delay times. One design currently in use is direct chip attach (DCA). In this design chips are flip-chip mounted onto a substrate, usually ceramic, and the assembly sealed in an enclosure for environmental protection. The environmental protection is required to protect the semiconductor and interconnections against corrosive elements and mechanical disturbances. The inclusion of enclosures for environmental protection results in larger packages with larger distances between semiconductor chips and thereby longer signal delays.

Several interconnection technologies have been developed for use in DCA designs. TAB tape utilizes the periphery of the semiconductor chip as does fine pitch surface mount (FPT). Inherent in these designs is that the peripheral leads increase the space required by each semiconductor chip. Again this increase in chip spacing results in longer signal delays.

The ball grid array (BGA) technology is an area array interconnect design, wherein the front surface of the semiconductor chip is utilized for an array of solder spheres used to interconnect to the next level of package. This arrangement allows for the interconnects to remain within the area of the semiconductor chip.

As dimensions of semiconductor devices became smaller an additional demand on semiconductor chip interconnects has emerged. Alpha particles emitted from solder alloys used as interconnects in BGA designs, have been shown to cause semiconductor devices to malfunction. Interconnections that contain solder alloys need to be physically spaced away from the semiconductor devices. One design approach is to include copper pillars on the surface of the semiconductor chips. This approach is disclosed in U.S. Patent Application Publication U.S. 2002/0033412A1 dated Mar. 21, 2002. The copper pillars are incorporated between the solder of the BGA and the surface of the semiconductor chip so as to reduce the effect of the alpha particles on the devices.

First level package designs need to address the following:
  Allow for reliable interconnections to the chip surface and to the next level of package.
  Protect the chip and the interconnects from chemical corrosion.
  Protect the chip from physical and mechanical disturbances, (shock and vibrations.)
  Allow for the addition of thermal enhancements as required by the application.

A present design that has been shown to be capable of addressing the above demands is shown in FIG. 1 (Prior Art). A semiconductor chip 10 that has a flip chip interconnect 12 on the front surface is bonded onto an interposer 14 that has printed metallurgy to connect the chip I/Os to peripheral TAB connections 16. The assembly is encapsulated in a plastic compound 18 for environmental protection. Although this design satisfies the criteria set above it has the disadvantage of increasing the area required by the semiconductor chip by 4x~9x, due to the use of the interposer, or first level package.

SUMMARY OF THE INVENTION

The main objective of the invention is to provide a package design and method of fabrication for semiconductor chips that eliminates the need for a first level package. The package design should provide reliable interconnections to the chip and to the next level of package. In addition it needs to protect the semiconductor chip and the interconnections from the environment.

Another objective is for the invention to provide a method for manufacturing the semiconductor chip package in a reliable and efficient manner.

An additional objective is for the package to have a minimal impact on increasing the area required by the semiconductor chip.

Another objective of the present invention is to allow the backside of the semiconductor chip to be exposed for the addition of a thermal heat sink also to be used for electrical contact to the semiconductor chip.

The above objectives are achieved by the present invention by providing a design and method of manufacture for a semiconductor chip grid array (CGA) package.

An embodiment of the present invention is shown in FIG. 2. The semiconductor chip 20 with conductive pillars 22 and solder balls 24 is encapsulated in a molding compound 26. A bottom view is shown in FIG. 2A. The bottom side of the semiconductor chip is exposed to allow for the attachment of a heat sink 28 as shown in FIG. 3. The package has a fully encapsulated or molded semiconductor chip and provides a CGA for interconnect to the next level of package while eliminating the need for a substrate or interposer.

A manufacturing method for the semiconductor CGA package utilizes a single sided adhesive tape that carries the semiconductor chips. The semiconductor chips include solderable pillars. The tape with the semiconductor chips backside mounted progresses through a molding process that forms a molded panel of a quantity of chips. The units are then etched to expose the edges of the copper pillars, separated from the tape, solder is screen printed or solder ball mounted on the etched edge of the pillars and reflowed to form the solder balls of the BGA. The units may be tested at this stage. The molded semiconductor chip BGA assemblies are then separated into single chip modules.

BRIEF DESCRIPTION OF THE DRAWINGS

FIG. 1 is a conventional single chip module of the prior art.

FIG. 2A is a cross-sectional view of a first embodiment of the CGA of the invention.

FIG. 2B is a bottom view of the first embodiment of the C GA of the invention.

FIG. 8 is a cross-sectional view of the chip level CGA with the solder balls attached.

DETAILED DESCRIPTION OF THE PREFERRED EMBODIMENT

The decrease in semiconductor device sizes has resulted in VLSI integrated circuit chips with a large number of circuits per chip. The increase in circuits per chip has resulted in increased demand for interconnections to the chip. In order to meet the demand for the higher number of interconnections the use of BGA interconnection technology is being used extensively. BGA or solder ball technology has shown it can provide the high interconnection density required by allowing for close spacing of the interconnects as well as utilizing the total area of the semiconductor chip.

The new micron sized devices have been shown to be susceptible to alpha particle emissions that cause significant errors. Lead and lead alloys emit small amounts of alpha particles. In order to minimize the deleterious effects of the alpha particles copper pillars have been used. See U.S. Patent Application Publication U.S. 2002/0033412A1 herein incorporated by reference. The pillars displace the lead based solder and move it to a distance from the semiconductor devices as to minimize the alpha particle effects.

The present invention discloses a package design and method of manufacture for semiconductor chips that utilize pillar interconnections. The present invention is shown in FIG. 2A. The semiconductor chip 20 that includes solder tipped copper pillars 22 is molded in an encapsulant 26 that surrounds the chip and the pillar. Lead-tin solder balls or bumps or solder paste 24 of different solder compositions are attached to the solder tip pillars and extend beyond the encapsulant for connection to the next level of package. The molded encapsulant 26 is fashioned by molding to expose the backside of the semiconductor chip as shown in FIG. 2A. A bottom view with the array of solder balls of the CGA is shown in FIG. 2B.

Figure 3B:
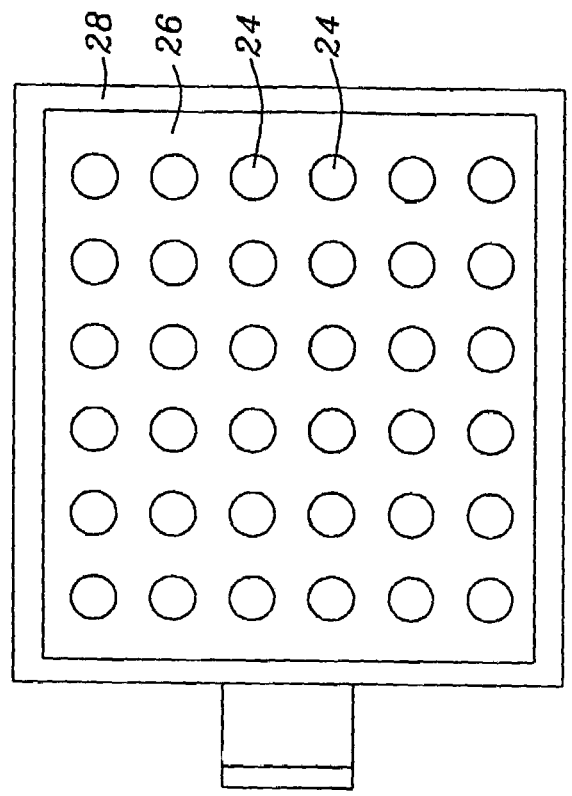
FIG. 3B is a bottom view of the second embodiment of the CGA of the invention.

A second embodiment of the present invention is a thermally enhanced package utilizing a thermal heat sink attached to the backside of the exposed semiconductor chip. The thermally enhanced package is shown in FIGS. 3A and 3B.

Figure 3A:
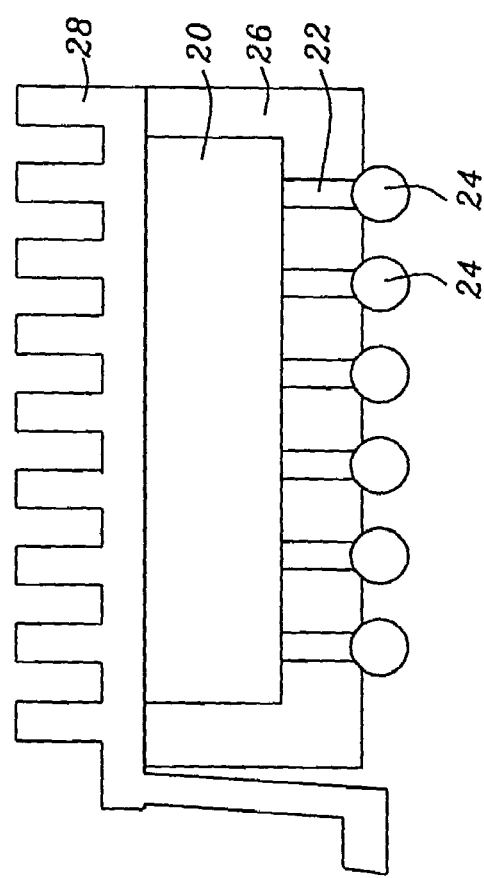
FIG. 3A is a cross-sectional view of the second embodiment of the CGA of the invention.

The CGA module designs shown in FIGS. 2A and 3A satisfy the demands of a first level package. Semiconductor chip 20 is molded in an encapsulant for environmental protection, the solder balls or solder paste of the CGA are properly positioned for the next level of assembly and reliably connected to the semiconductor chip pillars. In addition, the semiconductor chip is positioned on the adhesive tape in a manner that allows for a simplified die attached process. Fluxing, solder reflow and flipping the die are eliminated.

Figure 9:
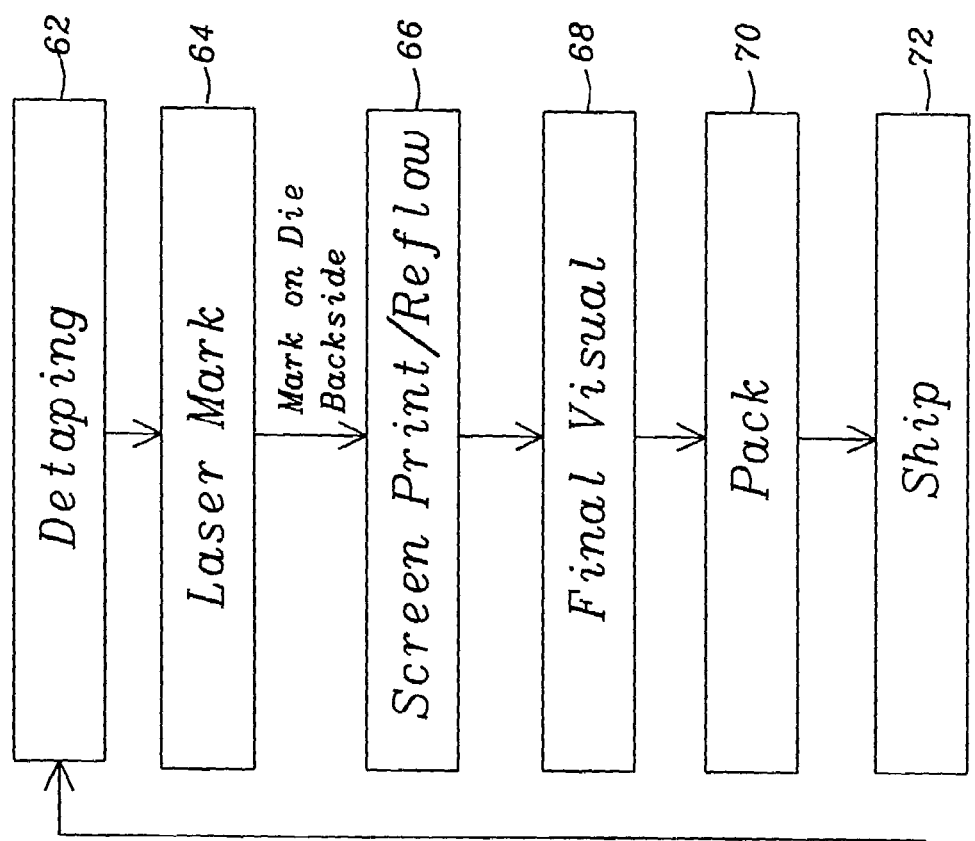
FIG. 9 outlines the process flow used in the present invention.

The method of manufacture of the CGA semiconductor module of the present invention and disclosed herein consists of the following steps and is outlined in FIG. 9.

Figure 4:
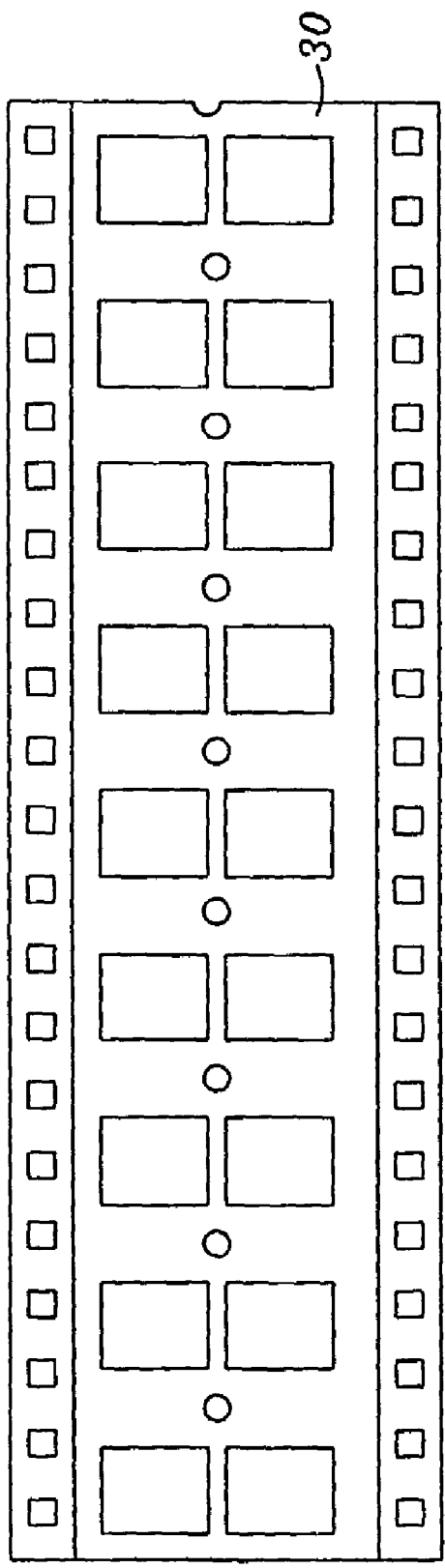
FIG. 4 is a top view of the single sided adhesive tape used in the invention.
Figure 5:
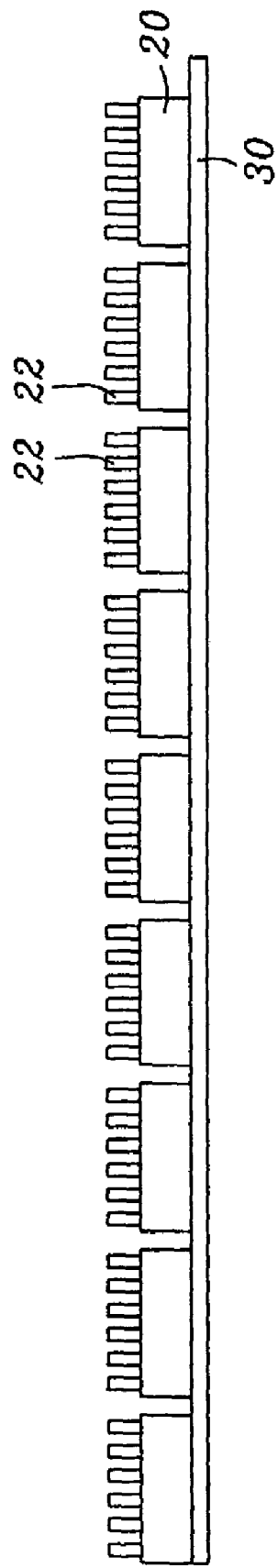
FIG. 5 is a cross-sectional view of chips used in the invention mounted on the single sided adhesive tape.

A single sided adhesive tape 30 shown in FIG. 4 is used to support an array of semiconductor chips backside bonded to the adhesive tape. This is the chip attached process 54 in FIG. 9.

Figure 6:
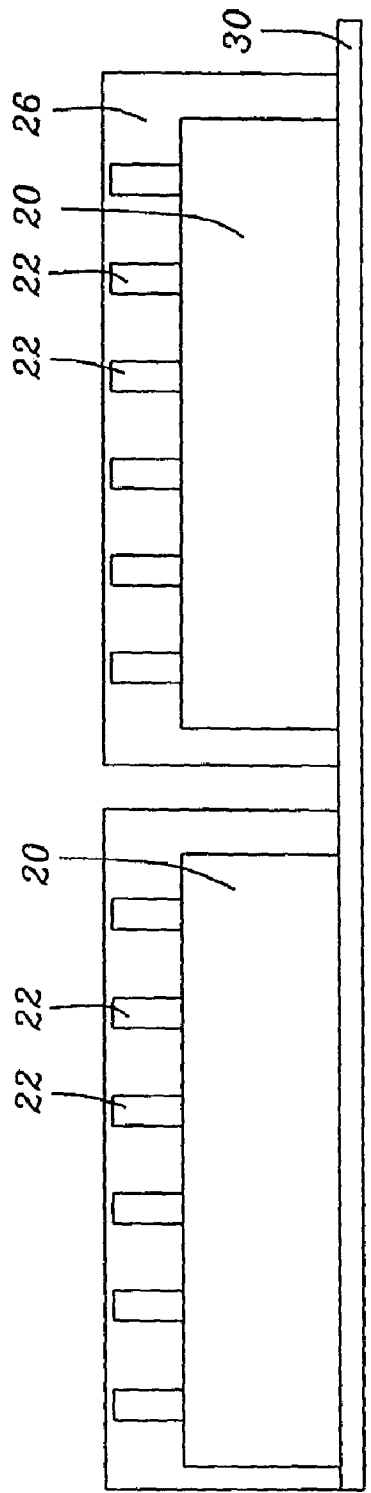
FIG. 6 is a cross-sectional view of the molded panel used in the invention on the single sided adhesive tape.
Figure 7:
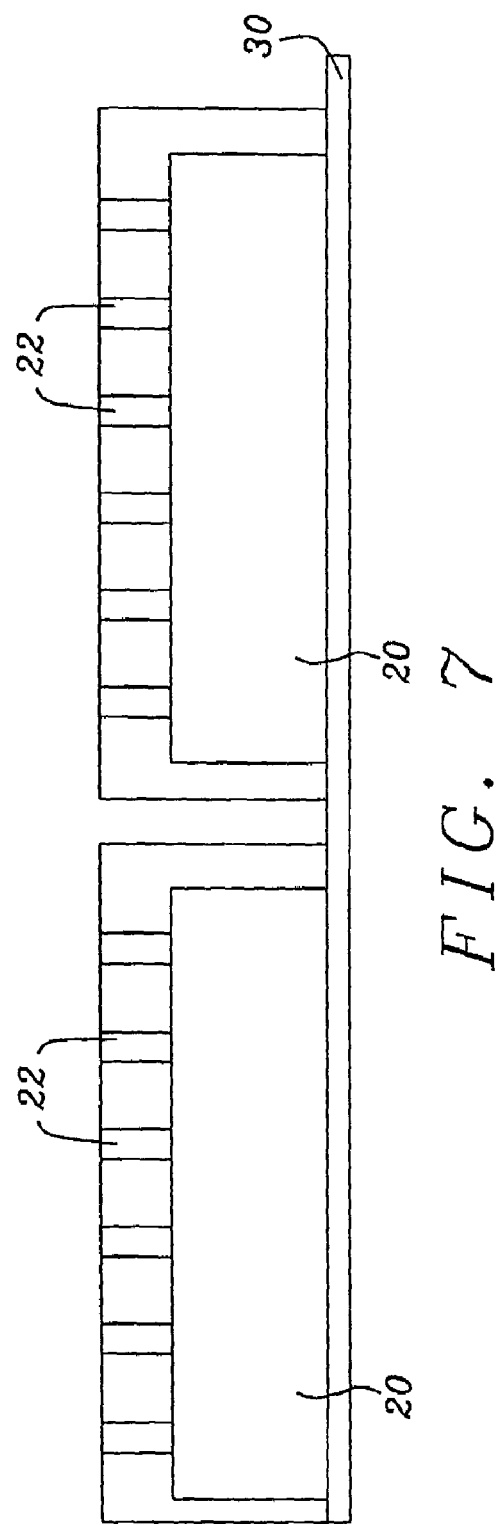
FIG. 7 is a cross-sectional view of the molded panel used in the invention after the molding compound has been etched.

The adhesive tape 30 with a multiplicity of semiconductor chips 20 is molded in an encapsulant 26 shown in FIG. 6, and process step 58 of FIG. 9.

The molding compound is etched from the front side of the semiconductor chip exposing the edge of the copper pillars process step 60.

Solder is then introduced to the assembly and solder balls 24 are formed by screen printing or solder ball mounting and reflowing to allow for connection to the semiconductor chip pillars 22, FIG. 8, and process step 66 of FIG. 9.

For the second embodiment of the present invention a metal heat sink 28 is bonded to the backside of the molded semiconductor chip as shown in FIG. 3A.

The present invention, the design and method of manufacture of a CGA semiconductor chip package has been shown to satisfy the demands placed on a semiconductor chip first level package. It protects the semiconductor and interconnects from environmental exposure and allows for use of a CGA interconnect to the next level of package. The addition of a bonded heat sink also allows for use in high heat dissipation applications.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip level semiconductor chip package comprising:
a molded encapsulant surrounding a semiconductor chip that utilizes interconnection pillars, wherein said encapsulant surrounds the front and sides of said semiconductor chip and interconnection pillars and allows for contact to the pillar edge and backside of the semiconductor chip; and a chip grid array (CGA) of solder balls or bumps attached to said interconnection pillars that provide electrical connections to each pillar.

2. The structure of claim 1 further comprising a heat sink connected to the exposed said backside of said semiconductor chip used for thermal enhancement.

3. The structure of claim 2 wherein said heat sink provides electrical connection to said backside of said semiconductor chip.

4. The structure of claim 1 wherein said chip is a silicon semiconductor.

5. The structure of claim 1 wherein said solder balls or bumps of said CGA are Pb-Sn solder.

6. The structure of claim 1 wherein solder paste is used for the CGA.

7. The structure of claim 1 wherein said chip comprises a semiconductor material.

8. The structure of claim 1 wherein said chip comprises a GaAs semiconductor.

9. The structure of claim 1 wherein said encapsulant comprises an opaque material.

10. The structure of claim 1 wherein said encapsulant comprises a transparent material.

11. A chip level semiconductor chip package comprising:

a molded encapsulant surrounding a semiconductor chip that utilizes interconnection pillars, wherein said encapsulant surrounds the front and sides of said semiconductor chip and interconnection pillars and wherein said encapsulant does not cover a top edge of each of said interconnection pillars and the backside of said semiconductor chip;

a chip grid array (CGA) of solder balls or bumps attached to said top edge of said interconnection pillars that provides electrical connections to each pillar; and a heat sink connected to the exposed said backside of said semiconductor chip used for thermal enhancement.

12. The structure of claim 11 wherein said chip comprises a semiconductor material, silicon, or GaAs.

13. The structure of claim 11 wherein said solder balls or bumps of said CGA are Pb-Sn solder.

14. The structure of claim 11 wherein solder paste is used for the CGA.

15. The structure of claim 11 wherein said encapsulant comprises an opaque or transparent material.

16. The structure of claim 11 wherein said heat sink provides electrical connection to said backside of said semiconductor chip.

* * * * *